United States Patent
DeVito

(10) Patent No.: US 12,057,297 B2
(45) Date of Patent: Aug. 6, 2024

(54) DEPOSITION SYSTEM WITH INTEGRATED COOLING ON A ROTATING DRUM

(71) Applicant: Richard DeVito, Jamaica Plain, MA (US)

(72) Inventor: Richard DeVito, Jamaica Plain, MA (US)

(73) Assignee: Richard Devito, Jamaica Plain, MA (US)

( * ) Notice: Subject to any disclaimer, the term of this patent is extended or adjusted under 35 U.S.C. 154(b) by 0 days.

(21) Appl. No.: 16/823,046

(22) Filed: Mar. 18, 2020

(65) Prior Publication Data

US 2020/0219704 A1    Jul. 9, 2020

Related U.S. Application Data

(63) Continuation-in-part of application No. 16/355,405, filed on Mar. 15, 2019, now abandoned, which is a
(Continued)

(51) Int. Cl.
*H01J 37/32*    (2006.01)
*C23C 14/00*    (2006.01)
(Continued)

(52) U.S. Cl.
CPC .... *H01J 37/32458* (2013.01); *C23C 14/0047* (2013.01); *C23C 14/0063* (2013.01);
(Continued)

(58) Field of Classification Search
CPC ... C23C 14/50; C23C 14/541; H01J 37/32458
(Continued)

(56) References Cited

U.S. PATENT DOCUMENTS 3,962,062 A * 6/1976 Ingrey ................... C03C 17/225
                                                   204/192.22
4,851,095 A    7/1989 Scobey et al.
(Continued)

FOREIGN PATENT DOCUMENTS

EP    3 279 364 A1    2/2018
JP    63018074        1/1988
(Continued)

OTHER PUBLICATIONS

Translation to Nakajima (JP 2009-155683) published Jul. 2009.*
(Continued)

*Primary Examiner* — John J Brayton
(74) *Attorney, Agent, or Firm* — Potomac Law Group, PLLC; Reza Mollaaghababa

(57) ABSTRACT

In one aspect, a system for depositing a film on a substrate is disclosed, which comprises at least one metallization source for generating metal atoms, and at least one reactive source for generating at least one reactive species. The system further includes an inner cooling cylinder and a substrate cylinder, where the inner cooling cylinder is fixedly positioned relative to the substrate cylinder, and the substrate cylinder at least partially surrounds the inner cooling cylinder. At least one mount is coupled to the substrate cylinder for mounting one or more substrates to the substrate cylinder.

26 Claims, 14 Drawing Sheets

Related U.S. Application Data continuation of application No. 15/331,091, filed on Oct. 21, 2016, now Pat. No. 10,262,838.

(60) Provisional application No. 62/244,964, filed on Oct. 22, 2015.

(51) Int. Cl.
  | | | |
  |---|---|---|
  | *C23C 14/12* | (2006.01) | |
  | *C23C 14/14* | (2006.01) | |
  | *C23C 14/50* | (2006.01) | |
  | *C23C 14/54* | (2006.01) | |
  | *H01J 37/34* | (2006.01) | |

(52) U.S. Cl.
  CPC .......... *C23C 14/0078* (2013.01); *C23C 14/12* (2013.01); *C23C 14/14* (2013.01); *C23C 14/50* (2013.01); *C23C 14/541* (2013.01); *H01J 37/321* (2013.01); *H01J 37/32192* (2013.01); *H01J 37/32733* (2013.01); *H01J 37/3405* (2013.01); *H01J 2237/20214* (2013.01); *H01J 2237/3321* (2013.01)

(58) Field of Classification Search
  USPC ........................................ 204/298.24, 298.26
  See application file for complete search history.

(56) References Cited

U.S. PATENT DOCUMENTS

| | | | | |
|---|---|---|---|---|
| 6,143,149 | A * | 11/2000 | Abe | .................... C23C 14/3407 204/192.12 |
| 6,274,014 | B1 * | 8/2001 | Matsumoto | ......... C23C 14/0047 204/298.06 |
| 6,736,943 | B1 * | 5/2004 | Scobey | ............... H01J 37/3405 204/192.12 |
| 7,510,634 | B1 * | 3/2009 | Klawuhn | .............. C23C 14/046 204/192.17 |
| 7,828,900 | B2 * | 11/2010 | Hatanaka | ................ C23C 16/34 204/298.25 |
| 8,758,580 | B2 | 6/2014 | Devito | |
| 9,530,629 | B2 * | 12/2016 | Teers | .................. H01J 37/3405 |
| 10,262,838 | B2 | 4/2019 | DeVito | |
| 2002/0086553 | A1 * | 7/2002 | O'Donnell | .............. B01J 19/02 438/761 |
| 2007/0151842 | A1 | 7/2007 | DeVito et al. | |
| 2011/0005923 | A1 * | 1/2011 | Schnappenberger | ...................... H01J 37/3497 204/298.11 |
| 2012/0045588 | A1 | 2/2012 | DeVito | |
| 2014/0262765 | A1 * | 9/2014 | DeVito | ................. C23C 14/345 204/298.26 |
| 2016/0189936 | A1 | 6/2016 | Chia | |
| 2016/0189939 | A1 * | 6/2016 | Deppisch | ............ H01J 37/3405 204/192.12 |
| 2017/0117119 | A1 | 4/2017 | DeVito | |
| 2018/0037986 | A1 * | 2/2018 | Derckx | ............ H01J 37/32724 |
| 2019/0214234 | A1 | 7/2019 | DeVito | |

FOREIGN PATENT DOCUMENTS

| | | | |
|---|---|---|---|
| JP | 06172987 | | 6/1994 |
| JP | 06172987 | A * | 6/1994 |
| JP | 06322528 | | 11/1994 |
| JP | 06322528 | A * | 11/1994 |
| JP | 2009155683 | A * | 7/2009 |
| WO | 9214859 | A1 | 9/1992 |
| WO | 2011135667 | A1 | 11/2011 |
| WO | 2017070488 | A1 | 4/2017 |

OTHER PUBLICATIONS

International Search Report and Written Opinion, PCT/US2016/058147, dated Mar. 8, 2017, 11 pages.
International Search Report and Written Opinion, PCT/US2021/022882, dated Jul. 15, 2021, 13 pages.

* cited by examiner

DEPOSITION SYSTEM WITH INTEGRATED COOLING ON A ROTATING DRUM

CROSS-REFERENCE TO RELATED APPLICATION

The present application claims priority as a continuation-in-part application to U.S. patent application Ser. No. 16/355,405, filed on Mar. 15, 2019, which is a continuation application of U.S. patent application Ser. No. 15/331,091 (now U.S. Pat. No. 10,262,838), filed on Oct. 21, 2016, which in turn claims priority to Provisional Application No. 62/244,964, filed Oct. 22, 2015, the contents of these applications are incorporated herein by reference in their entirety.

FIELD OF THE INVENTION

The invention relates generally to a thin film deposition system. More specifically, the invention relates to a magnetron sputtered reactive ion assisted deposition system with separate metallization and reaction zones and with an integrated radiative cooling mechanism.

BACKGROUND

DC Magnetron Sputtering is a thin film deposition technique. For example, sputtering can occur in an environment containing Argon gas (Ar). A negative DC potential is applied to a conductive metal "target." A plasma discharge is established to ionize the gas thereby creating Ar+ ions. The positively charged Ar+ ions accelerate towards the negatively charged target and cause ejection of the target atoms through sputtering, which in turn creates a metal film on an opposing placed substrate.

Introduction of reactive gases such as $O_2$ or $N_2$ can cause the film to take on properties of the compounds created by the reaction of these gases with the deposited metal film. Further ionization and acceleration of these reactive gases can enhance the reactivity between the gas and the film in addition to improving the density of the film as well as influence other film properties such as the film stress, hardness, index and absorption.

Conventional deposition systems are complex and suffer from issues including reduced wafer throughput and material contamination issues, which can limit film quality and require extended preventative maintenance cleaning of the deposition equipment. Conventional deposition systems use a batch chamber where sputter source and ion source are placed in close proximity to one another, resulting in cross talk between their respective plasmas, and where oxidation is simultaneous with film deposition.

In reactive sputtering in a batch system, there is always concern about arcing from the insulating layers that build up on the DC sputtered target. Any layers that form on the sputter target or on the anode of the ion source that are non-conductive can act as a capacitor, which when its charge is built up to the break down voltage of the insulating layer, can discharge, forming an arc. The arc can cause the ejection of particles from this layer into the chamber and onto the substrates. Severe arcing may even shut down the power supplies interrupting the process run. This effect is sometime referred to as poisoning of the target with the reactive gas. Total poisoning of the target can shut down the DC process as the target now appears as an open circuit to the DC supply powering the magnetron.

RF sputtering can be used to circumvent this poisoning effect since RF power is unaffected by insulating materials. However, RF sputtering is a much more inefficient process for power delivery to the target versus heat generated at the target. Asymmetric Bipolar Pulsing the target with devices such as a SPARCLE™ or Pinnacle Plus™ and similar such devices have met with some measure of success but particles can still be ejected from the non-eroded racetrack area of the target and there is also slight reduction in deposition rate. There are also various techniques which apply closed loop controls to the reactive gas mass flow controller (MFC) to curtail target poisoning using plasma emission spectroscopy Speedflow™.

U.S. Pat. No. 8,758,580 discloses a deposition system that produces reacted films in separate sputter and ion beam zones. However, an aperture over the magnetron is required to build up a pressure difference between the argon at the magnetron and the much lower $O_2$ pressure from the ion source. The resulting pressure gradient prevents target poisoning, but at the cost of reduction in target utilization. From a cost of ownership issue this can be potentially problematic even for relatively inexpensive aluminum targets. Further, US 20070151842 A1 discloses producing reacted films in separate zones using a sputter and ion beam zones. Differential pumping of the sputter source is used to prevent target poisoning. Additionally, since the sputtering is performed downward on a circular disc, a uniformity aperture must be used between the target and substrate to tune the film uniformity.

Accordingly, there is a need for a deposition system and method that address the shortcomings described above.

SUMMARY

In one aspect, a system of depositing a film on a substrate is disclosed, which includes at least one metallization source for generating metal atoms, and at least one reactive source for generating at least one reactive ionic species. The system further includes a pair of inner and outer concentric cylinders, where the outer cylinder has first and second openings positioned relative to the metallization source and the reactive source to allow entry of the metal atoms and the reactive ionic species into a metallization region and a reaction region, respectively, between the two cylinders. At least one mount is coupled to the inner cylinder for mounting the substrate thereto such that said substrate is in radiative thermal communication with the inner surface of the outer cylinder, said inner cylinder being rotatable for moving the substrate between the two regions so as to expose the substrate alternatingly to said metal atoms and said reactive ionic species. Further, the outer cylinder includes at least one cooling channel through which a cooling fluid can flow for maintaining the inner surface of the outer cylinder at a temperature suitable for radiative cooling of the substrate.

The system can further include an evacuated chamber in which the inner and the outer cylinders are disposed.

The cooling of the inner surface of the outer cylinder can be achieved in a variety of different ways. For example, at least one cooling channel can be mounted onto the outer surface of the outer cylinder. Alternatively, at least one cooling channel can be incorporated within the wall of the outer cylinder.

A variety of metallization and reactive sources can be employed. By way of example, the metallization source can be a magnetron sputtering source. In some embodiments, the metallization source can be a magnetron sputtering source for generating aluminum (Al) atoms.

In some embodiments, a plurality of metallization sources can be employed, where each source generates a different metal. By way of example, two metallization sources can be angularly separated from each other outside of the outer cylinder and the outer cylinder can have openings, each associated with one of the sources for introducing metal atoms into a space between the two cylinders to metalize one or more substrate mounted on the inner cylinder. In some such embodiments, multiple metallization sources can be installed to achieve alloy deposition of films or nanolaminate deposition of two different materials. In one application of such an embodiment, one metallization source can be operated to deposit a metal film on substrate and another metallization source can be operated at a low power to introduce metal dopants into the deposited metal film.

Further, a variety of reactive ionic species can be employed. By way of example, the reactive ionic species can include any of oxygen, nitrogen and a carbon-containing ion. The carbon-containing ion can be, for example, a hydrocarbon, such as $CH_4$. In some embodiments, the at least one reactive ionic species can include a mixture of at least two different reactive ionic species. By way of example, such a mixture can include oxygen and nitrogen ions.

In some embodiments, the reactive source is a plasma source, e.g., an inductively coupled plasma (ICP) source. In some embodiments, the reactive source can be a microwave source. In some embodiments, the reactive source is disposed in an evacuated vestibule.

In some embodiments, at least one baffle (typically a pair of baffles) is coupled to the outer cylinder in a space between the outer and the inner cylinder so as to limit conductance of the ionic species from the reaction region to the metallization region.

In some embodiments, the inner surface of the outer cylinder exhibits an emissivity coefficient greater than about 0.7. By way of example, the inner surface of the outer cylinder (or at least a portion thereof) can be treated with an alumina flame spray. Plasma spray is one method for treating the inner surface of the outer cylinder with alumina flame spray.

In some embodiments, a cooling fluid flows through at least one channel coupled to the outer cylinder so as to maintain its inner surface at a temperature less than about 273 K, e.g., in a range of about 273 K to about 77 K.

In a related aspect, a system for depositing a film on a substrate is disclosed, which includes a metallization region including a metallization source for metal deposition, a reaction region including a reactive source, such as an ion source, for generating at least one reactive ionic species, a mount for mounting at least one substrate, a cooling surface in thermal communication with said mount for cooling said at least one substrate via radiative cooling, where the mount is movable so as to move said at least one substrate between said metallization region and said reaction region in order to deposit a metal film on the substrate in said metallization region and to react said metal film with said reactive species in said reaction region.

In some embodiments, the system can include at least one cooling channel thermally coupled to the cooling surface. A cooling liquid can circulate through the cooling channel for removing heat from the cooling surface. By way of example, the cooling surface can be maintained at a temperature in a range of about 273 K to about 77 K.

The mount can include an inner cylinder rotatable about an axis, such that rotation of the inner cylinder moves the substrate between the metallization region and the reaction region, where the cooling surface is at least a portion of an inner surface of an outer cylinder disposed concentrically relative to the inner cylinder. The outer cylinder is fixedly positioned relative to the metallization source and the reactive source.

The outer cylinder can include a first opening positioned relative to the metallization source to allow deposition of a metal film on the substrate and a second opening positioned relative to the reactive source to allow exposing a metal film deposited on the substrate to the reactive species.

In some embodiments, active radiative cooling of a substrate is achieved, for example, in a manner discussed in more detail below.

The above system can further include at least one baffle (typically a pair of baffles) for substantially isolating the metallization region from the reaction region. A cooling channel is coupled to the outer cylinder through which a cooling liquid can flow to extract heat from the inner cooling surface of the outer cylinder. In some embodiments, the inner surface of the outer cylinder can exhibit an emissivity coefficient greater than about 0.7.

In one aspect, a system for depositing a film on a substrate is disclosed, which comprises at least one metallization source for generating metal atoms, and at least one reactive source for generating at least one reactive species. The system further includes an inner cooling cylinder and a substrate cylinder, said inner cylinder being fixedly positioned relative to the substrate cylinder, said substrate cylinder at least partially surrounding said inner cooling cylinder. At least one mount is coupled to the substrate cylinder for mounting the substrate thereto, said at least one mount having an opening for exposing at least a portion of a back surface of the substrate to the inner cooling cylinder so as to provide radiative thermal communication between the substrate and the inner cylinder. The substrate cylinder is rotatable for moving the substrate between a metalization region and an ion reaction region so as to expose the substrate alternately to metal atoms and reactive ion species. Further, the inner cooling cylinder comprises at least one cooling channel through which a cooling fluid can flow so as to maintain the inner cylinder at a temperature suitable for radiative cooling of one or more substrates mounted to the substrate cylinder. The inner cooling cylinder and the substrate cylinder are positioned concentrically relative to one another.

In some embodiments, the outer surface of the inner cooling cylinder (i.e., the surface in thermal communication with the substrate(s)) exhibits an emissivity coefficient of at least about 0.7.

In some embodiments, the system can further include an outer cylinder that is positioned so as to at least partially surround the pair of inner cooling cylinder and the substrate cylinder. The outer cylinder is fixedly positioned relative to the metallization source and the reactive source and includes first and second openings positioned relative to the metallization source and the reactive source to allow entry of metal atoms and the reactive ionic species into a metallization region and a reaction region, respectively, between the substrate cylinder and the outer cylinder so as to expose a front surface of at least one substrate to the metal atoms and the reactive ionic species as the rotation of the substrate cylinder brings the substrate in substantial register with said openings.

In some embodiments, the metallization source comprises a magnetron sputtering source. Further, in some such embodiments, the reactive ion species comprises any of oxygen ion, nitrogen ion and a carbon-containing ion. In some embodiment, the carbon-containing ion comprises a hydrocarbon. By way of example, in some embodiments, the hydrocarbon comprises $CH_4$. In some embodiments, the reactive ion source comprises a plasma source. In some embodiments, the reactive ion source comprises a microwave source. In some embodiments, the plasma source comprises an inductively-coupled plasma (ICP) source. In some embodiments, the at least one reactive species comprises a mixture of at least two different reactive species. By way of example, the mixture of at least two different reactive species comprises a mixture of oxygen and nitrogen ions. In some embodiments, the magnetron sputtering source is configured to generate aluminum atoms for forming an aluminum film on the substrate and the reactive source is configured to generate oxygen ions for reacting with said aluminum film to form an aluminum oxide layer on said substrate. In some embodiments, the reactive source is disposed in an evacuated vestibule.

In some embodiments, a pair of baffles is coupled to the outer cylinder to limit conductance of the ionic species from the reaction region to the metallization region. In some embodiments, an outer surface of the inner cylinder is treated with alumina flame spray.

In some embodiments, the cooling fluid maintains the outer surface of the inner cooling cylinder at a temperature less than about 273 K.

Further understanding of various aspects of the invention can be obtained by reference to the following detailed description in conjunction with the associated drawings, which are described briefly below.

DETAILED DESCRIPTION

Figure 1:
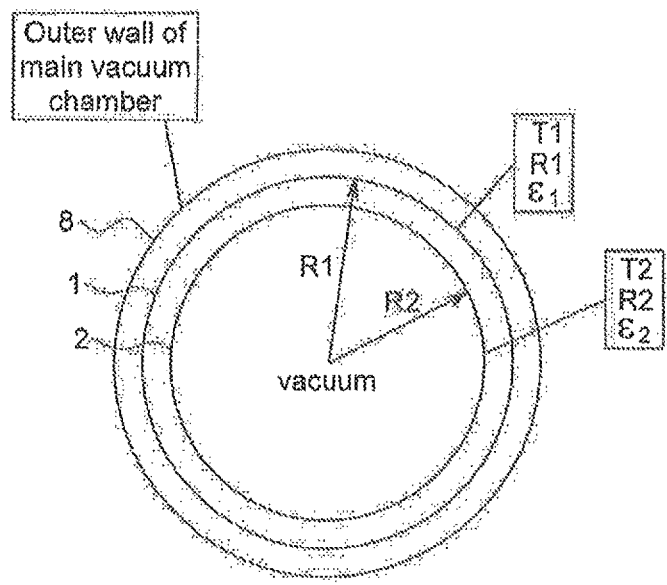
FIG. 1 is a schematic diagram showing two concentric cylinders according to aspects of the present disclosure.

The present disclosure is generally directed to deposition of metal thin films on substrates, e.g., via magnetron sputter deposition, and their subsequent reaction and in some cases densification by exposure to a reactive species generated, for example, by a plasma or ion source, as well as temperature control, e.g., during deposition.

As used herein, the term "reaction" refers to a chemical reaction, such as "oxidation," nitriding or carburization of a film by one or more active ionic species, such as for example $O_2$, $N_2$ or some form of carbon-containing ionic species. As discussed in more detail below, such ionic species can be introduced onto a deposited metallic film as a gas. Although various embodiments discussed below employ oxidation reactions, it should be understood that the present teachings are not limited to oxidation and can employ other reactions, such as those noted above. The term "about" as used herein denotes a variation of less than 5% around a numerical value.

In many embodiments, the film sputtering and the subsequent oxidation take place sequentially in separate metallization and reaction zones. This is in contrast to many prior art systems that use a batch chamber in which a sputter source and an ion source are placed in close proximity to one another, resulting in cross talk between their respective plasmas, and where oxidation is simultaneous with film deposition. By contrast, in various embodiments disclosed herein, both film deposition and film exposure to reactive species are shielded from one another by one or more conductance limiting shield.

By way of example, in one embodiment, a sputtered film, for example, represented as metal M, can be deposited as a thin layer on a substrate mounted onto a rotating drum that moves the substrate past a sputter source. The thin metal layer can be subsequently oxidized as the drum rotates the substrate past a plasma source, which bombards the film with activated and ionized $O_2$ and argon ions. These ions possess sufficient energy and density, e.g., an average energy in a range of about 30 eV about 300 eV and a beam current equal to or greater than 1 ampere for typical metal deposition rate of equal to or less than 5 A/rev (angstroms per revolution), such that when they impinge on the film they can oxidize and densify the metal film M into an oxidized film of the form $M_yO_x$. For example, if M is aluminum, then one would obtain $Al_2O_3$ upon oxidation with a plasma source. In some embodiments, each film deposition stage can result in the deposition of a film having a thickness, e.g., equal to or less than 5 A/rev. Multiple stages of metal deposition and exposure to reactive ionic species, e.g., as a substrate mounted on a rotating drum makes multiple passes through a metallization region and a reaction region, can result in a total film thickness, e.g., up to about 7 A/rev when fully reacted.

Embodiments disclosed herein allow for the deposition of a metal on a substrate using reactive magnetron sputtering in an open loop mode using a standard DC sputtering supply such as an MDX™ or Pinnacle™ or similar DC sputtering supply with no need for feedback control of the MFC. Further, no pulsing is required since the process of metallization and reaction take place in separate zones with no cross talk between the respective plasmas. Due to this separation, there can be insignificant build-up, and in some cases no build-up, of insulating layers, which could otherwise cause arcing. Additionally, very high effective rates of metal oxide generation can be achieved using this method. An added benefit due to the setup of the conductance limiting shield or baffle is to allow temperature control, and specifically reduction of the deposition temperatures to low temperatures of <100° C. that allow extrinsic stress control of the film, as well as deposition on temperature sensitive substrates such as plastic (e.g. polycarbonate).

Further, there is no need in embodiments disclosed herein for the use of any aperture over the magnetron to build up a pressure difference between the argon at the magnetron and the much lower $O_2$ pressure from an ion source. Therefore, target utilization is only limited by magnetron design. Further, embodiments disclosed herein may use a cylindrical structure for substrate mounting. In some such embodiments, no uniformity tuning may be needed across the substrate surface for flat substrates.

According to aspects disclosed herein, it is desirable to have control over three inputs in the deposition process: substrate temperature, deposition rate and film stress. In many embodiments, the substrate temperature is mainly governed by power input during the metallization and reaction processes. For example, power can be input from heat lamps as heat to the substrate to increase atom mobility and produce more stable and dense films. Power can also come from the deposition and/or reaction processes themselves. If $P_1$ is the power input to the substrate due to the magnetron, and $P_2$ is the power input to the substrate due to the ion source, the total power input is $P_{total}=P_1+P_2$. Note that $P_1$ is not the actual power into the magnetron but the power input from the growing film due to the film deposition from the magnetron and other energetic particles. Likewise for the ion source, $P_2$ contributes to the substrates' temperature during film growth due to the ion energy and flux density (beam current). The temperature of substrates may rise quickly during the initial stages of plasma deposition, and may eventually level off, reaching quasi thermal equilibrium, and proceeding to slowly rise to some final value at the end of the deposition cycle.

The control of substrate temperature during film growth is important for several reasons. First, the substrate's temperature can affect the film stress, as one aspect of film stress is directly linked to temperature during processing, as discussed further below. Second, for temperature sensitive substrates such as plastics, the substrate's temperature must stay well below the softening point so that they do not deform during the deposition process. This is especially important, for example, in plastic optical components and lenses, since raising their temperatures beyond their softening point can change their optical and/or mechanical tolerances. For example, the temperature of polycarbonate or Lexan™ should be kept below 115° C. to avoid deformation.

The deposition temperature can have a significant role in the total film stress. As described in Milton Oring: The Material Science of thin Films Academic Press 1992, the total film stress is given by:

$$\sigma t = \sigma_{intrinsic} + \sigma_{thermal} \qquad (1)$$

The intrinsic stress component can be caused by many factors such as inclusions, defects, bombarding energy of incoming particles, etc. Total stress, $\sigma_t$ in equation (1) can be measured by finding the bow in a substrate and from that calculating the stress using the modified Stoney equation. The effect of the thermal component of the film stress and how it can be controlled by controlling substrate temperature during deposition is of particular interest in various embodiments disclosed herein.

The temperature or thermal component of the film stress is expressed as:

$$\sigma_{thermal} = \frac{(\alpha_1 - \alpha_2)(T_1 - T_2)E_f}{(1 - v_f)} = \Delta\alpha\Delta T(k) \qquad (2)$$

where $T_1$ is the final temperature and $T_2$ is the initial temperature of the substrate, $\alpha_1$ is the coefficient of thermal expansion (CTE) of the substrate over the $\Delta T$ range, $\alpha_2$ is the CTE of the growing film over the same temperature range, $v_f$ is Poissons ratio for film, $E_f$ is the Young Modulus for the film, and k is $E_f/(1-v_f)$. Depending on the difference between the CTE of the substrate and the growing film ($\Delta\alpha$), the final stress component can be either tensile or compressive. Since one does not have control over CTE as it is determined based on fixed properties of the film and substrate, one way to minimize this component of stress is to minimize $\Delta T$ in the above equation.

The cooling of substrate mounted on a rotating drum may be achieved via a coolant flowing through serpentine stainless lines affixed or welded to the drum, which receive the coolant via a rotating Ferrofluidic™ type feedthrough. However, these feedthroughs can be very expensive and have been known to leak over time. Furthermore, substrates are usually held in place by point contact or flush mounted to a puck to maximize conductive cooling, in which case thermal heat transfer is limited by poor interface coupling. Even for the best cooled drums, cooling for the substrate in a vacuum in this way is extremely inefficient. For insulating substrates such as glass and plastic, which are poor thermal conductors, cooling in this way is even more inefficient.

According to aspects of the present disclosure, it is shown that the use of radiative cooling can have a significant impact on the reduction of the film temperature during deposition, thus enabling the deposition of relatively thick films on temperature sensitive substrates without their deformation or melting even in cases where substrates/film combination have a large $\Delta\alpha$.

Various embodiments disclosed herein may use radiative cooling, a passive cooling method using the film/substrate emissivity, and the absorptivity of a cooled surface placed in close proximity to the film/substrate, such that the heat generated in the film/substrate by the processes to which the film/substrate is exposed, such as the metal deposition process, is absorbed by the cooled surface. Using a large enough surface area and a low enough temperature of the cold surface, radiative cooling can be an effective method not only for temperature reduction but also for temperature control using a feedback loop to a cooling generator.

Consider two surfaces in close proximity to one another. Surface 1 is at temperature $T_1$ with emissivity $\varepsilon_1$ and surface 2 is at temperature $T_2$ with emissivity $\varepsilon_2$, assuming $T_2>T_1$. The heat transfer rate ($\dot{Q}_{12}$) from the warm to cool surface is then given by:

$$\dot{Q}_{12} = \frac{A1\sigma(T1^4 - T2^4)}{\frac{1}{\varepsilon 1} + \frac{1}{\varepsilon 2} - 1} \qquad (3)$$

where A1 is the area of the surface 2 at the higher temperature and σ is Boltzmann's constant. By controlling the temperature of the cooling surface and the relative emissivities of the two surfaces, a significant impact on heat removal from surface 2 to surface 1 can be implemented.

In various embodiments disclosed herein, two concentric cylinders are used instead of flat surfaces, one for mounting one or more substrate(s) and the other for providing a cooled surface for radiative cooling of the substrate(s). FIG. 1 shows two concentric cylinders, an outer cylinder of radius $R_1$ and outer area $A_1$, and an inner cylinder of radius $R_2$. For example, in various embodiments, the cylinder of radius $R_1$ would be the cooled cylinder and the cylinder of radius $R_2$ would be the substrate holder or carrier. The heat transfer rate ($\dot{Q}_{12}$) from the warm to cool surface for the concentric cylinders is then given by:

$$\dot{Q}_{12} = \frac{A1\sigma(T1^4 - T2^4)}{\frac{1}{\varepsilon 1} + \frac{1-\varepsilon 2}{\varepsilon 2}\left(\frac{R1}{R2}\right)^2} \quad (4)$$

where $\varepsilon_1$ and $\varepsilon_2$ denote, respectively, the emissivity of the surfaces of the inner and outer cylinders that are in radiative thermal communication with one another.

In order to maximize the radiative heat transfer from the hot to the cold cylinder, based on equation (4), one may maximize the temperature difference, which can be expensive, or may optimize the emissivity, or both. As both $\varepsilon_1$ and $\varepsilon_2$ approach 1, equation (4) is maximized for fixed temperatures.

Emissivity can be affected, among other factors, by surface finish. Table I below lists the emissivities for various substrates and surface treatments.

TABLE I emissivity of various materials

| Surface Material | Emissivity Coefficient - ε - |
|---|---|
| Alumina, Flame sprayed | 0.8 |
| Aluminum Commercial sheet | 0.09 |
| Glass smooth | 0.92-0.94 |
| Bead blasted SS | 0.44 |
| aluminum sand blasted | 0.22 |

For example, for glass, which is a popular substrate material, the emissivity is about 0.9. This is true for a wide range of glasses. To maximize the transfer of heat, in many embodiments, the inner surface of the outer cylinder has preferably an emissivity close to 1. Polished aluminum or stainless steel (SS) has an emissivity (ε) of only about 0.1. Even bead blasted SS or aluminum will only have ε of about 0.22. However, if the SS surface is treated by the plasma flame spray method, that is flame sprayed alumina is deposited over a stainless steel shell, one can obtain an emissivity of about 0.8. This will be shown below (see FIG. 2) to be particularly preferable for transfer of heat from the inner cylinder to the outer cylinder.

Figure 2:
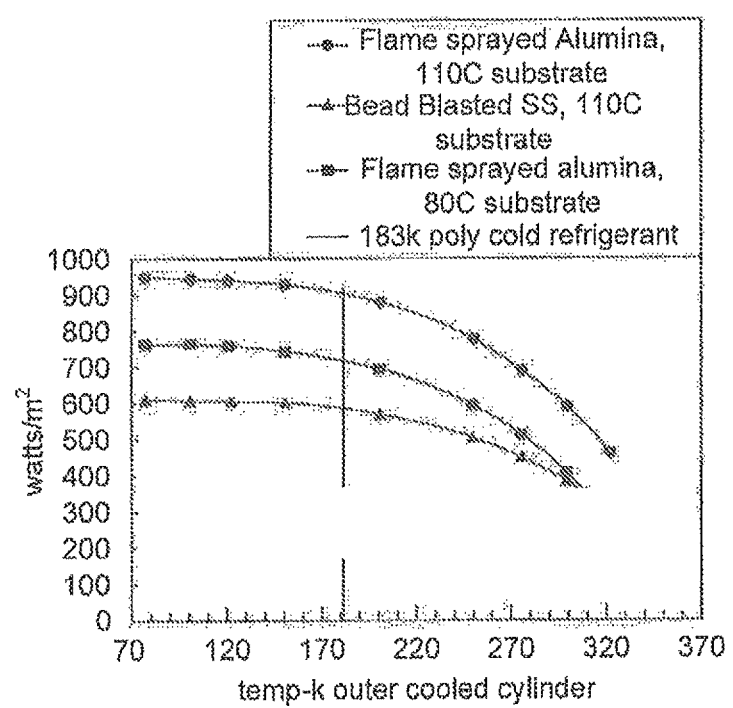
FIG. 2 is a graph showing the results of a theoretical calculation for heat removal from the inner cylinder for various substrate materials and emissivities as a function of the temperature of the outer cooled cylinder, according to aspects of the present disclosure.

FIG. 2 is a graph of equation (4), showing the effectiveness or lack of radiation heat transfer for various combinations of emissivities in Table I for two concentric cylinders, with the outer cylinder being cooled and the inner cylinder being heated by the deposition process. FIG. 2 shows the superiority of cooling capacity of an alumina flame sprayed stainless surface versus stainless steel that has been subjected only to bead blasting. These graphs also show that for any surface there is a saturation in heat removal for any cold surface for a temperature around 170-180 K. This ideally happens to be the optimum operational temperature of many industrial cryogenic refrigerators such as a Polycold™ from Helix Co. These are commercially available cryogenic coolers which can be used effectively in cooling large surface areas such as the cylinders in various embodiments disclosed herein. FIG. 2 also shows the heat removal capacity for the alumina flame spray stainless for temperatures of 80° C. and 100° C. on the inner cylinder, which is the typical temperature range for keeping a plastic type substrate.

Surface treatments such as flat black or Cat-A-Lac™ Black Paint can also be used to treat metal surfaces to adjust surface emissivity in order to obtain values close to 1. However, in various embodiments disclosed herein, the use of flame spray is more advantageous as it also possesses the ability to reduce particulates during the film deposition process. For example, a film deposited on a metal surface may develop a stress, and after conversion to an oxide that stress may be exacerbated. Eventually, for a smooth surface, the stress build up and the combination of adhesion and stress may cause the film to erupt off. The eruption of these films will cause flaking and particles to be deposited through the chamber and on the substrates. However, a surface treated with flame spray can be about 1000 times rougher than a bead blasted surface. Hence, the amount of film that can be deposited on the flame spray treated surface can be many orders of magnitude greater before the surface loses its ability to "grab" the film. The reason is that the film will not be a continuous stressed body as in smooth surfaces or even in bead blasted surface, which can become planarized by deposition of growing films once it gets to some critical thickness. Once this critical thickness occurs, the top film layer is continuous again and the stress build up will eventually cause delamination or buckling in these layers. The flame sprayed surface does not suffer from these issues as the surface is very rough and is not planarized, so the film is never continuous over large areas. For example, a properly prepared flame sprayed alumina stainless steel surface can survive the direct deposition of up to ¼" of silicon for a sputtering target without producing any buckling.

Figure 3:
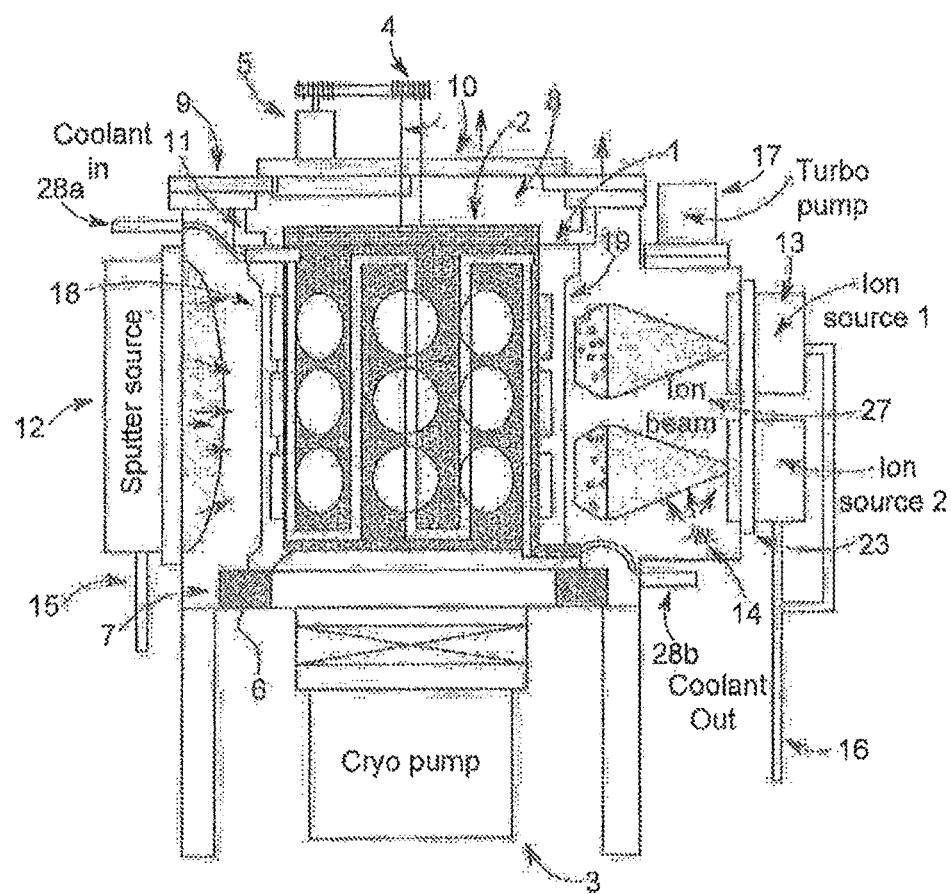
FIG. 3 is a side view of one embodiment of a deposition apparatus according to aspects of the present disclosure.

FIG. 3 shows one embodiment of a deposition apparatus configured according to aspects of the present disclosure. The deposition apparatus includes an stainless steel chamber 8, which is pumped by a cryogenic pump 3. An assembly of two concentric cylinders is inserted within the chamber 8. The outer cylinder 1 is fixed, and has an inner surface treated with an alumina flame spray 26 as described above and shown in FIG. 7. In other embodiments, the outer cylinder may be treated with different finishes. The inner cylinder 2 is rotatable by a rotating vacuum feedthrough mechanism 4 attached on the atmospheric side of the top plate 10 of the chamber 8, and driven by a variable speed motor 5. The outside surface of the outer cylinder 1 has a series of hollow cooling channels or weldments 6, which allow a cooling substance such as a cooling liquid, cryogen or gas to be flowed and recycled through a cooling system which is set to some operational condition. For example, as shown, coolant may flow in at inlet 28*a* and exit at outlet 28*b*.

The outer fixed cylinder 1 is affixed to stand offs 7, which also serve to thermally isolate the cylinder from chamber 8. Chamber 8 has two top mounted lift mechanisms. Flange or mount 9 may be lifted by a hoist (not shown), which may lift both the outer and inner cylinders 1 and 2. Outer cylinder 1 is affixed to flange or mount 9 by attachment mechanism 11. This mechanism may be made of a thermal isolating material such as alumina. Moreover, the top plate or flange 10 may also be lifted by a separate hoist, thereby lifting only the internal cylinder 2 from the vacuum chamber 8 to allow loading of substrates.

On either side of chamber 8, 180 degrees apart, are a metallization source 12, shown herein as a magnetron sputter cathode, and a reactive source or ion source 13, shown herein as an ion source assembly with electron neutralizer 14. In the embodiment of FIG. 3, the electron neutralizer 14 is depicted as a filament. However, it is to be understood that a hollow cathode (H/C) neutralizer may also be used in various embodiments. The gas flows are fed by separate mass flow controllers to the magnetron 12 and ion source 13 by conduits 15 and 16, respectively. A vacuum pump 17 is disposed in the ion source area. The vacuum pump 17 may be a turbomolecular pump. In various embodiments, more than one pump may be used depending on the number of ion sources and the required gas throughput. The pump or pumps in this area provide gas throughput of the gases being fed to the ion source 13 and/or the electron neutralizer 14.

The reactive source or ion source is enclosed in a vestibule 27 below the vacuum pump 17. The purpose of a pump 17 on the ion source vestibule 27 is to provide additional pumping speed, since the conductance of cylinders 1 and 2 limit the pumping speed to the ion source 13 from pump 3. However, the ion source 13 is preferably operated under a gas load at $2\text{-}7\times10^{-4}$ torr as measured at gauge 29 shown in FIG. 7. For this to occur, additional pumping speed is provided by the pump 17. This only modesty contributes to the overall pump speed for process gas coming from the magnetron sputter sources.

The outer cylinder 1 may have a plurality of openings, such as cutouts or openings 18 and 19 as shown in FIG. 3. These cutouts or openings allow atoms from the magnetron 12 and ions from the ion source 13 to strike the rotating inner cylinder 2 and the substrates thereon. In this embodiment, aperture or opening 18 disposed on the outer cylinder 1 allows the sputter film to deposit on the rotating inner cylinder 2 and the substrate attached thereto, whereas aperture 19 allows ions to bombard the rotating inner cylinder 2 and the substrate attached thereto.

Figure 4A:
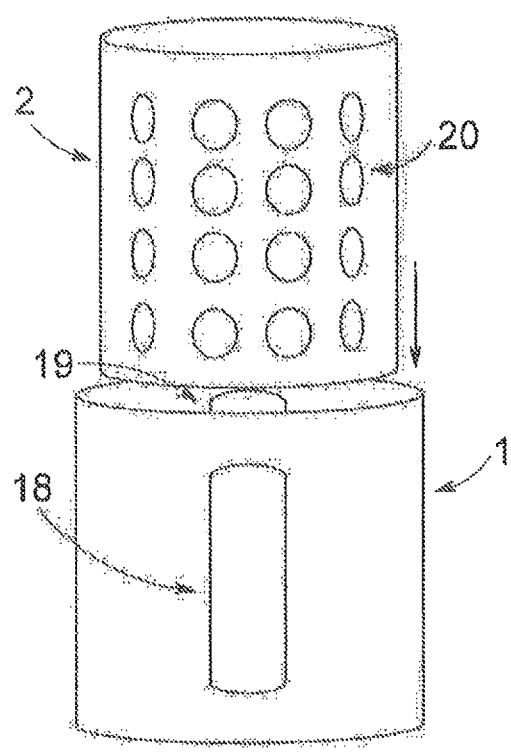
FIG. 4A is a perspective view of the inner cylinder being inserted into the outer cylinder according to aspects of the present disclosure.
Figure 4B:
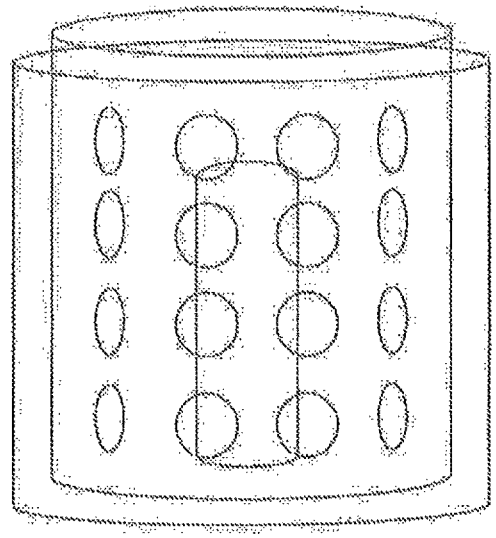
FIG. 4B is a perspective view showing the assembled cylinders according to aspects of the present disclosure.

FIG. 4A shows the outer cylinder 1 and the inner cylinder 2 being inserted into the outer cylinder. The outer cylinder 1 is shown to include apertures 18 and 19. However, other embodiments may include more than two apertures. The inner cylinder 2 is shown to include a plurality of substrates 20 mounted thereto. FIG. 4B shows the assembled structure of FIG. 4A, with the concentric cylinders 1 and 2. As the inner cylinder 2 rotates, the substrates 20 are exposed through the apertures 18 and 19 to the metallization region and the reaction region.

Figure 5:
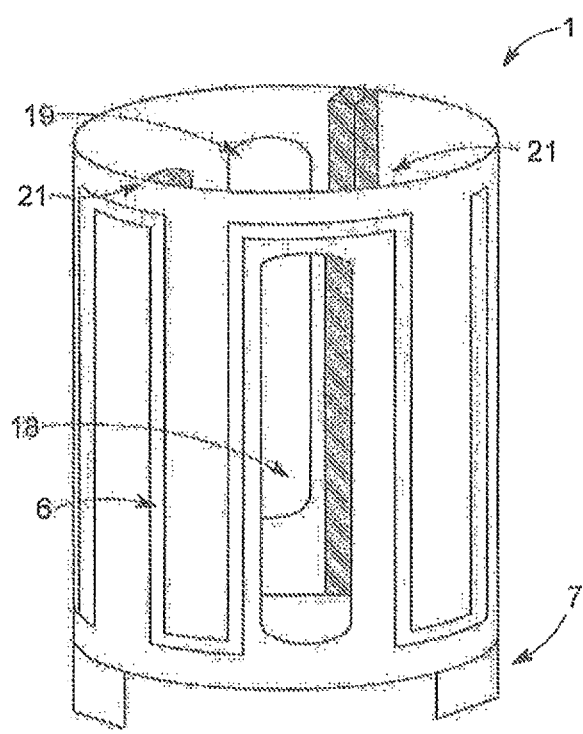
FIG. 5 is a perspective view of the outer cylinder showing cooling channels and conductance baffles according to aspects of the present disclosure.
Figure 6:
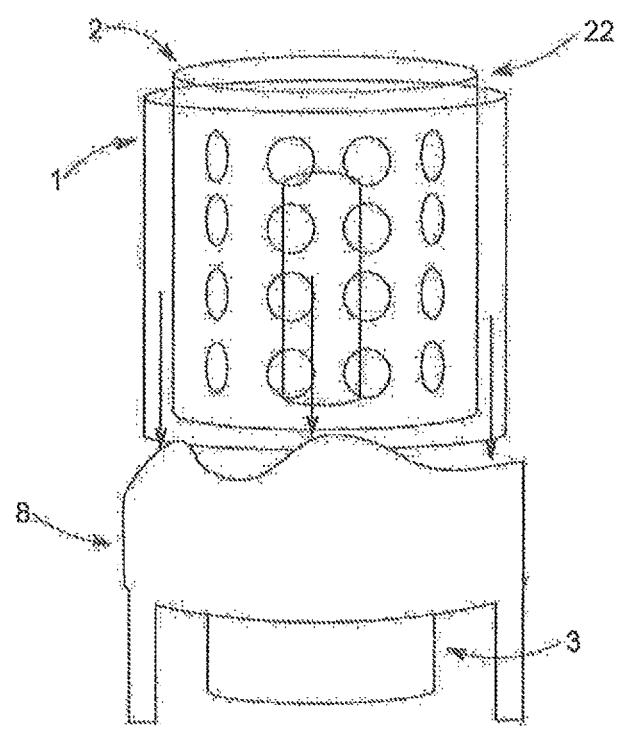
FIG. 6 is a cutaway view of a vacuum chamber, showing the assembly of cylinders therein and the pumping of gas through the inter-annular distance according to aspects of the present disclosure.

FIG. 5 shows the outer cylinder 1 having cooling channels 6. The outer cylinder 1 is coupled to conductance limited baffles 21, as shown. FIG. 6 is a cutaway view of vacuum chamber 8, showing the assembled cylinders including the outer cylinder 1 and the inner cylinder 2 therein. As shown by the arrows in FIG. 6, gas (such as $O_2$ or other ion source gas) is pumped through the inter-annular distance 22, which is the space between the outer cylinder 1 and the inner cylinder 2, towards the cryogenic pump 3.

Figure 7:
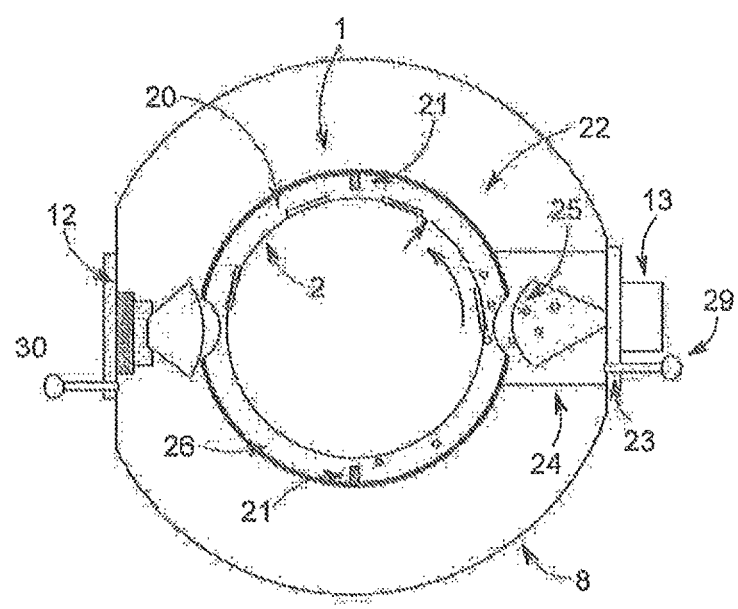
FIG. 7 is a top view of the deposition apparatus of FIG. 3, configured according to aspects of the present disclosure.

FIG. 7 is a top view of the deposition apparatus of FIG. 3, showing the sputter source 12 and the ion source 13, a vacuum gauge 30 for measuring gas pressure at the magnetron, a pressure gauge 29 for measuring pressure at the ion source, the vacuum chamber 8, the outer cylinder 1 and inner cylinder 2 having substrates 20 disposed within the chamber 8, the flame sprayed inner surface 26 of the outer cylinder, the conductance limiting baffles 21, and the inter-annular distance or space 22 as marked between small arrows.

In various embodiments, the number of conductance limiting baffles and the inter-annular distance may be chosen based on the gas load from the ion source 13 and the speed of the cryogenic pump 3. The intra-annular distance 22 is chosen so as to optimize conductance for pump 3 so as to continually remove $O_2$ gas 25, to prevent the gas from traversing from the ion source 13 to the sputter source 12. Given the diameter of the two cylinders, the conductance of the structure may be calculated as follows. Conductance depends on whether the flow is molecular or viscous. As defined in A. Roth Vacuum Technology 3rd ed. 1990 Elsevier North Holland, if D is the pipe diameter and $P_{avg}$ is the average pressure:

$DP_{avg} > 0.5$ cm-torr/viscous flow $DP_{avg} < 0.005$ torr-cm/molecular flow

For example, for a 100 cm diameter cylinder and an average pressure of the ion source at $5\times10^{-4}$ torr of $O_2$ then PD=0.05. Technically this is called transitional flow, but since it is closer to molecular flow, the conductance of two cylinders of diameters D1=2*R1 and D2=2*R2 and length L may be estimated as described in Roth (A. Roth Vacuum Technology 3rd ed. 1990 Elsevier North Holland):

$$C = \frac{\pi}{3}\left[\frac{kT}{2\pi m}\right]^{1/2}\left[\frac{(D1^2 - D2^2)^2}{D1 + D2}\right](K/L) \qquad (5)$$

where K is a constant depending on the ratio of the two cylinder diameters, T is the temperature of the gas being modeled, and m is the mass of the gas being modeled. Using this equation, the conductance for a given pump 3 may be optimized such that the $O_2$ pressure is well below the ability to poison the sputter target.

Figure 8:
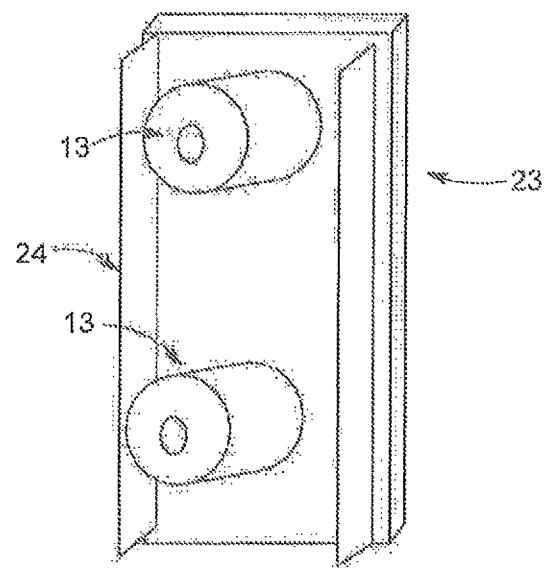
FIG. 8 is a detailed view of the ion source flange, showing ion sources and confinement shields according to aspects of the present disclosure.

FIG. 8 is a more detailed view of the ion source flange 23 shown in FIG. 7, further illustrating the two ion sources 13 in a linear arrangement with confinement shields 24 configured to confine the gas being introduced into the ion source area. Electron neutralizers are not shown in FIGS. 7 and 8 for clarity.

During operation of the embodiment described in relation with FIG. 3, the substrates 20 may be loaded into the chamber 8 by lifting the inner cylinder 2 from the chamber via a hoist (not shown) on flange 10. Once the substrates 20 are loaded, the inner cylinder 2 may be lowered back into the outer cylinder 1.

The chamber 8 may be pumped down by pump 3 and to some extent pump(s) 17. A base pressure of less than or equal to about $1\times10^{-6}$ torr is obtained as measured by a vacuum gauge such as a Bayard-Alpert hot filament gauge or equivalent high vacuum gauge. In this embodiment, the substrates are depicted as being manually loaded in a batch style system. In other embodiments, they may also be loaded in a loaded locked arrangement. In such an arrangement, the main process chamber is not vented to the atmosphere, but only the load locked portion through which substrates are transferred to the process chamber is exposed to the atmosphere.

When the base vacuum is obtained, a cryogenic coolant is allowed to flow to the cooling channels 6. The inner cylinder 2 may be rotated at a desired speed, for example at 100 revolutions per minute (rev/min), but the speed may vary from about 40 rev/min to about 600 rev/min. At this point, the reactive gas and/or argon gas may be introduced into the ion source(s) 13. The pressure may be set by gauge 29, shown in FIG. 7, to the optimum setting of the process. Gauge 29 may be a capacitance manometer type gauge, which is mass insensitive. The pressure range may be set based on the manufacturer's recommendation, but may be determined by the combination of the gas flow and beam parameters. It is possible to operate at a constant beam voltage and vary the gas flow so that the desired beam current is obtained. In one embodiment, the source may be operated in a range of about $1 \times 10^{-4}$ torr to about $8 \times 10^{-4}$ torr for pure gases or combination of gases.

When the ion source 13 is turned on to some predetermined beam voltage and beam current, the inner cylinder 2 may be rotated for a fixed time past the ion beam to pre-clean the substrates 20. The ion bombardment at the substrate may be tuned to remove several atomic layers of contaminant at the substrate surface. This may be estimated based on the voltage of the incoming ion beam, the current of the beam at the substrate, and the density and sputter yield of the substrate at the operating beam voltage. The etch rate ER or removal rate of the substrate can be expressed for normal incident ions in units of angstrom per minute (Ang/min) as:

$$ER\left(\frac{Ang}{\min}\right) = 62\left(\frac{SJA}{\rho}\right) \quad (6)$$

where S is the sputter yield (atoms/ion) at the beam voltage, J is the current density of the beam (mA/cm$^2$), A is the area in cm$^2$ and $\rho$ is the density of the material being removed (gm/cm$^3$). For a substrate rotating past the beam, the actual time in the beam is proportional to the area subtended by the beam in relation to the total surface area of the cylinder. The sputter yield of various substrate materials is available as a function of incoming ion voltage.

While the ion beam cleaning is occurring, a movable shutter may be placed over the magnetron. The purpose of the shutter is to shield any target atoms to prevent deposition on the substrate at this time. Argon gas may be fed into the magnetron and controlled by a mass flow controller such that the pressure is in a range of about 0.8 mtorr to about 10 mtorr. The gas pressure at the magnetron may be measured by a vacuum gauge 30, as shown in FIG. 7. The vacuum gauge may be a capacitance manometer. In some embodiments, gas may be provided to the sputter source 12 by a gas feed line. In other embodiments, gas may be fed directly into the magnetron for annular distribution around the ground shield. In yet other embodiments, gas may be fed from a gas ring distributed about the front of the magnetron. The flow of gas may be balanced against the overall speed of the pump 3 to give an operational pressure of about 0.1 torr to about $10^{-3}$ torr at the magnetron as measured by gauge 30. In the embodiment shown in FIG. 3, the gauge 30 is a capacitance manometer gauge, and the magnetron 12 is a linear magnetron. In other embodiments, the magnetron may be a cylindrical magnetron. The pressure due to gas flow at the ion source 13 may be registered on the magnetron gauge 30. It should be noted that gauge 29 should be nulled against that existing pressure so as to measure on gauge 29 the true pressure at the magnetron.

The power to the magnetron may be ramped up to some fixed power P1 for some quantity of time t1, to burn off any residual contaminants at the target surface. After the sputter target cleaning time, the argon is left to continue to flow to the sputter cathode 12, and the ion source 13 now has an amount of $O_2$ added to the argon gas already flowing in the ion source.

The ion beam voltage and current may be adjusted for the current process. When the shutter to the magnetron 12 is opened, metal atoms sputtered from magnetron are continuously deposited onto the rotating substrate as it passes by. The substrate subsequently passes by the ion source 13 and is quickly oxidized and densified via exposure to the argon and oxygen ion mix in the source. Depending on the film properties required, pure $O_2$ in the ion source may also be used. During the oxidation of the metal film, oxygen atoms that are not gettered away by the film will make their way around the cylinder by way of the inter-annular distance 22 as shown in FIG. 7. This $O_2$ gas cannot flow elsewhere in any substantial way, as it is confined by the confinement plates 24 as shown in FIGS. 7 and 8. As the $O_2$ travels in the inter-annular distance, the cryogenic pump 3 continuously pumps it out prior to reaching the magnetron aperture 18. The conductance limiting baffles 21 also hinder the mobility of the $O_2$ ions, and provide impedance to the $O_2$ flow traversing the inter-annular distance 22, thereby allowing more time for the $O_2$ to be pumped away by the pump 3. The net effect is to have an $O_2$ pressure of less than about $10^{-5}$ torr at the magnetron source 12. At this level of $O_2$, the metal removal rate of the magnetron significantly diminishes the probability of arcing at the magnetron due to poisoning.

In some embodiments, for a fixed rotational speed S1 of the inner cylinder, the power P1 applied to the magnetron is such that less than or equal to about 7 Angstrom/revolution of metal is deposited. If the metal thickness is greater, the incoming average ion energy which is between about 40-350 eV may not be sufficient for the ions to penetrate the metal layer to completely oxidize it. In one embodiment, the incoming ion energy is a mean energy for the gridless end hall ion source used. In other embodiments, gridded DC or RF ion sources may be used, although they have a lower beam current than end hall ion sources.

If the rotational speed were doubled and the power to the magnetron and ion sources were kept constant, the results may be unchanged as the metal deposition rate per revolution would be halved but the energetics of the end hall source do not produce over stoichiometric films at low beam energies. To increase deposition rate, one may double the magnetron power, which would double the deposition rate. In doing so, one would have to double the rotating speed to about 200 rev/min in addition to doubling the beam current. The beam voltage for this example would also increase slightly, but it is the beam current of the incoming ions of $O_2$ that must increase to maintain film stoichiometry. The constraints to produce quality films are driven by the ion source design and its operating pressure.

In one embodiment, the beam voltage cannot go below a minimum threshold, which may be about 30 to about 50 Volts depending on the film, as energetics do not produce stoichiometric films. Also, when the ion beam voltage is too great, such as greater than about 180 to about 250 Volts, then beam ions may begin to break bonds, causing films that are again absorbing. The beam voltage is a main driver in film stress behavior. As beam voltage is increased, films become more compressively stressed. As the beam voltage decreases, films become less compressively stressed.

In various embodiments, during the entire deposition process, the recirculating cryogenic coolant removes heat from the ion beam and sputter sources through radiative cooling. This cryogenic coolant may be run at a specific temperature, such as about 183 K. Therefore, the temperature of the substrate during the process may settle to some thermal equilibrium very quickly into the run and remain at that temperature thereafter. After the deposition is completed, the cryogenic refrigerant may be stopped, allowing the system to warm up to room temperature so that the system may be vented without thermal shock occurring to the substrates, and to prevent condensation on the cold substrates.

Figure 9:
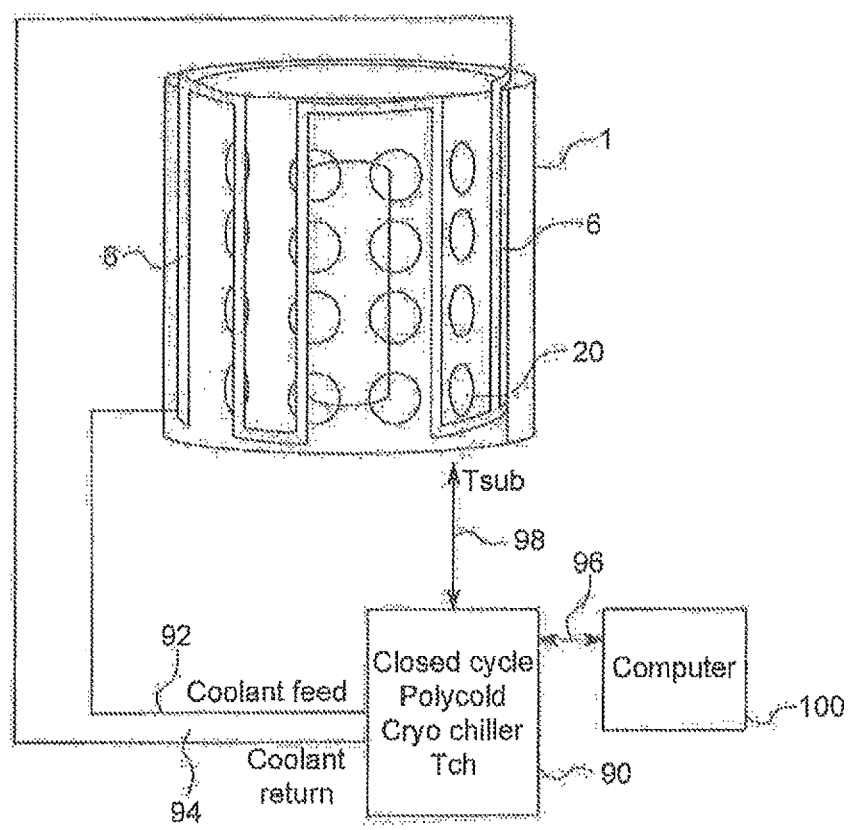
FIG. 9 is a schematic diagram showing active cooling of the substrates according to aspects of the present disclosure.

In some embodiments, the substrate temperature may be actively controlled, as opposed to just letting the substrates come to some arbitrary equilibrium temperature as discussed above. This may be implemented by using an optical pyrometer, such as an optical pyrometer marketed by K-Space Associates, measuring the temperature of the substrate, and using a feedback loop to the cryogenic cooler such that the chiller temperature is set to maintain a specific substrate temperature while balancing some amount of the input heat load. By way of example, FIG. 9 shows one embodiment that provides active cooling of substrates. As shown in FIG. 9, the deposition apparatus may include a chiller 90, having a temperature $T_{ch}$. For example, the chiller 90 may be a closed cycle Polycold cryogenic chiller. The chiller 90 is coupled to the cooling channels 6 of the outer cylinder 1, providing a coolant feed 92 and a coolant return 94. The chiller 90 may include a computer interface 96 with either an analog or digital I/O linked to a computer or processor 100. The substrate temperature $T_{sub}$ may be read in real time from a substrate as shown by interface 98, for example by using a pyrometer in reflectance mode. In one embodiment, $T_{sub}$ may be fed to an analog I/O port on the computer. In some embodiments, the chiller 90 may include the computer or processor 100. The computer or processor 100 may be configured or programmed to minimize the difference between the substrate set point temperature $T_{sub}$ and the actual measured temperature $T_{sub}$ by controlling the chiller temperature $T_{ch}$. In one embodiment, the controller may be a proportional integral derivative (PID) controller configured to drive $T_{ch}$ so as to control the substrate temperature by minimizing the difference between the measured and set point substrate temperatures. Other types of controllers may also be used in various embodiments.

One aspect of the method of conductively isolating the sputter and ion sources is that for a process using 100% $O_2$ in the ion beam, there is no argon present in the film down to the detection limits of Rutherford backscattered spectroscopy (RBS). If argon is introduced into the ion beam, then argon may be inserted into the growing film up to about 4-6%.

As discussed above, in the design of the two concentric cylinders 1 and 2 as disclosed herein, the intra-annular distance 22 between cylinders 1 and 2 may be chosen such that there is sufficient pumping speed for pump 3 to remove $O_2$ or any reactive gas used in the source that is not consumed in the ion assisted deposition process at the substrate through aperture 19. The $O_2$ reacts with the metal film M, where M is converted to MO. Any residual $O_2$ left must now be removed. The goal is to choose the speed of the pump 3 and the conductance such that the reduced $O_2$ left, if any, that reaches the magnetron, is in a range where arcing will be very unlikely to occur. This threshold limit may be set such that the rate of removal of metal from the target is much greater than the arrival rate of any residual $O_2$. The threshold limit may be less than about $1 \times 10^{-5}$ torr partial pressure of $O_2$ at the magnetron.

In some embodiments, instead of or in addition to utilizing an outer cooled cylinder for providing radiative cooling of one or more substrates, an inner cooled cylinder is employed for providing radiative cooling of one or more substrates mounted on a substrate cylinder, which surrounds the inner cooled cylinder (the inner cylinder is also herein referred to as a cooling cylinder as it is not only cooled but it also causes the radiative cooling of substrates undergoing processing). As discussed in more detail below, in some such embodiments, the inner cooled cylinder can be in radiative coupling with a back surface of the substrates mounted on the substrate cylinder so as to provide radiative cooling thereof. Further, in some embodiments, both an inner and an outer cooling cylinder can be employed for cooling a plurality of substrates mounted on a substrate cylinder disposed between the cooling outer and inner cylinders.

Figure 10:
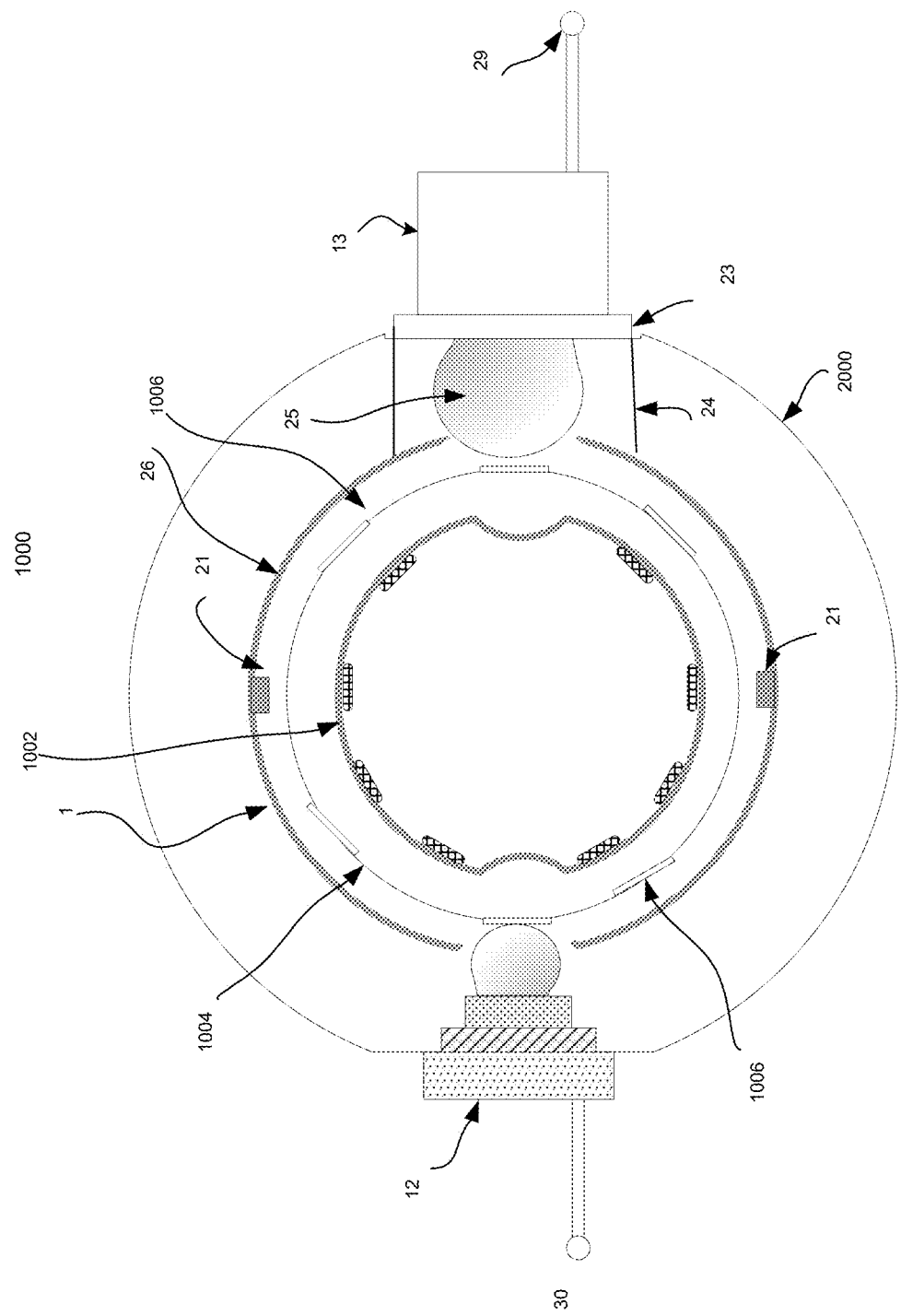
FIG. 10 schematically depicts an embodiment of a deposition system in which an inner cooling cylinder is employed to cool a plurality substrates mounted on a substrate cylinder surrounding the inner cooling cylinder, FIG. 11 schematically depicts another embodiment of a deposition system, which includes two cooling cylinders between which a substrate cylinder is positioned, FIG. 12 schematically depicts another embodiment of a deposition system, which includes a single cooling cylinder on an outer surface of which a plurality of cooling channels is disposed, and FIG. 13 schematically depicts another embodiment of a deposition system, which includes a single cooling cylinder on an inner surface of which a plurality of cooling channels is disposed.

More specifically, FIG. 10 schematically depicts a system 1000 for depositing a film on a substrate according to another embodiment. The system 1000 is similar to the deposition system discussed above in connection with FIGS. 3-7 except that the system 1000 includes an inner cooling cylinder 1002, which is fixedly positioned and is surrounded by a rotatable substrate cylinder 1004 on which a plurality of substrates 1006 can be mounted (herein also referred to as a substrate cylinder), e.g., in a manner discussed above in connection with the previous embodiments. More specifically, the substrate cylinder includes a plurality of mounts to which the substrates can be mounted, where each mount includes an opening that exposes a back surface of a substrate mounted thereto to the cooling inner cylinder.

Thus, the substrates can be mounted on the substrate cylinder such that the back of the substrates are in radiative coupling with an outer surface of the inner cooling cylinder. In this embodiment, the inner cooling cylinder includes a plurality of cooling channels 1008 through which a cooling medium can circulate so as to cool the inner cylinder to a temperature below that of the substrates mounted onto the substrate cylinder.

By way of example, in some embodiments, the cooling fluid can lower the temperature of the inner cooling cylinder to a temperature less than about 273 K. In some embodiments, the emissivity of the inner cooling cylinder, and in particular its outer surface, can be at least about 0.7. While in this embodiment the cooling channels 1008 are positioned on the inner surface of the cooling inner cylinder, in other embodiment the cooling channels 1008 can be positioned on the outer surface of the cooling inner cylinder.

Similar to the previous embodiment, the substrate cylinder is rotatable so as to expose the substrates alternatingly to the metalization source 12 and the source 13 generating reactive ionic species, e.g., in a manner discussed above in connection with the previous embodiments.

In this embodiment, the substrate cylinder and the inner cooling cylinder are housed within an outer cylinder 2000, which forms the structural housing of the deposition system. The outer cylinder 2000 is fixedly positioned relative to the substrate cylinder 1004 and the inner cooling cylinder 1002 and includes two apertures, where one of the apertures is substantially aligned with the magnetron and the other aperture is substantially aligned with the reactive ion source so as to allow the exposure of each mounted substrate to metal ions as well as the reactive ion species.

Figure 11:
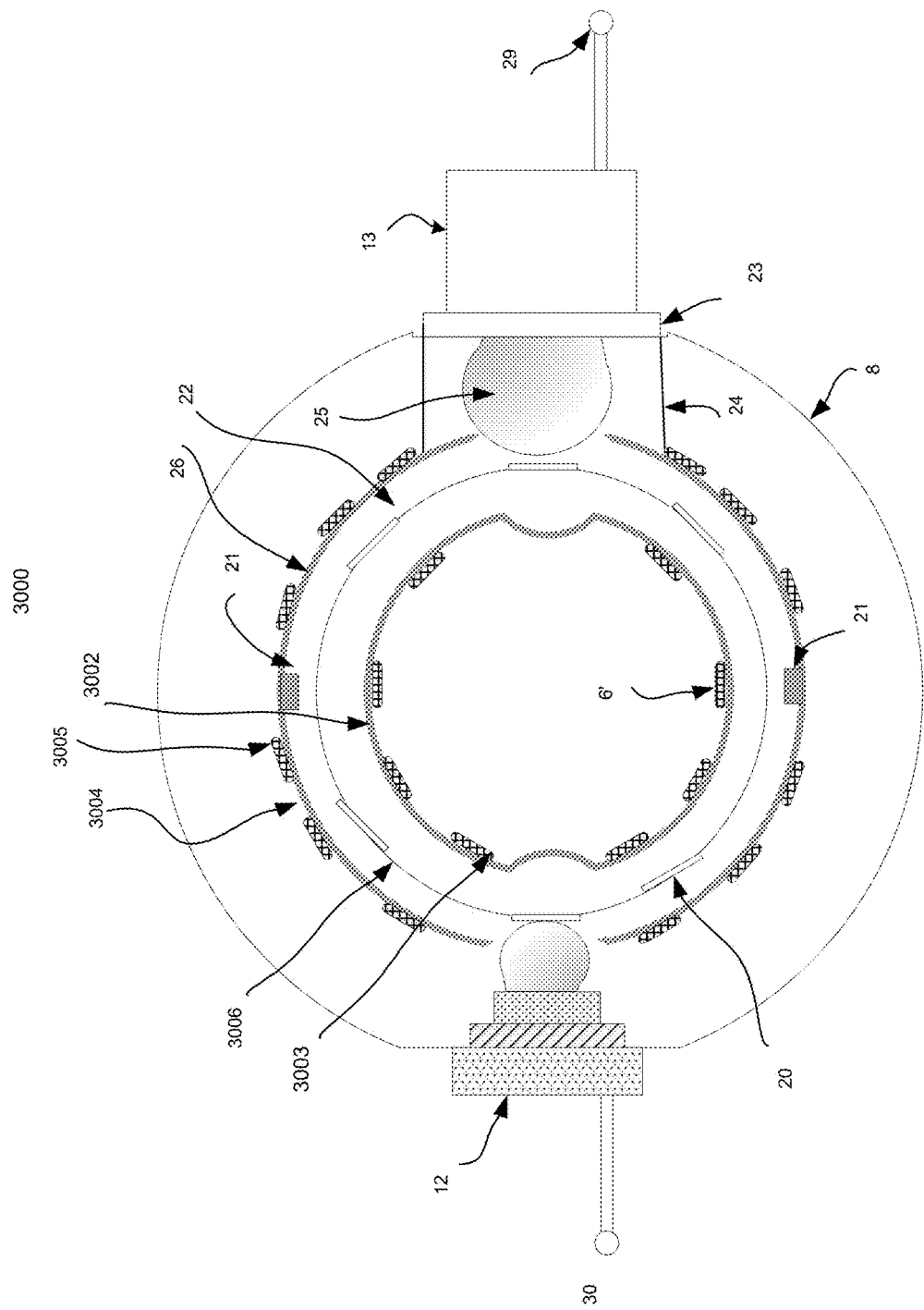

FIG. 11 schematically depicts a deposition system 3000 according to another embodiment, which includes an inner cooling cylinder 3002 having a plurality of cooling channels 3003 through which a cooling medium can flow and an outer cooling cylinder 3004 having cooling channels 3005, which are disposed on an outer surface of the outer cooling cylinder 3004. A substrate cylinder 3006 is sandwiched between the inner and the outer cooling cylinders.

Figure 12:
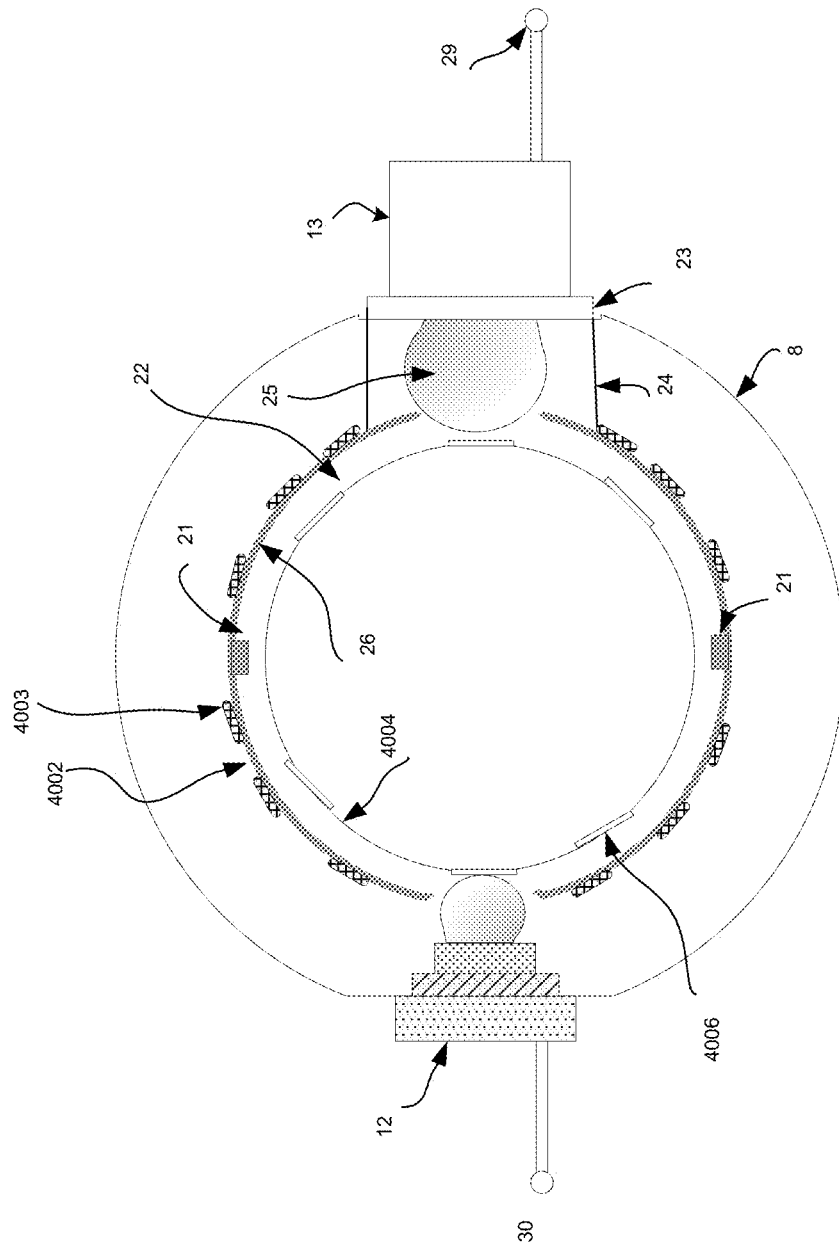

FIG. 12 schematically depicts a deposition system 4000 according to another embodiment, which includes a single cooling cylinder 4002 on an outer surface of which a plurality of cooling channels 4003 are disposed. The cooling cylinder 4002 surrounds a substrate cylinder 4004 and cools a plurality of substrates 4006 mounted onto the substrate cylinder 4004.

Figure 13:
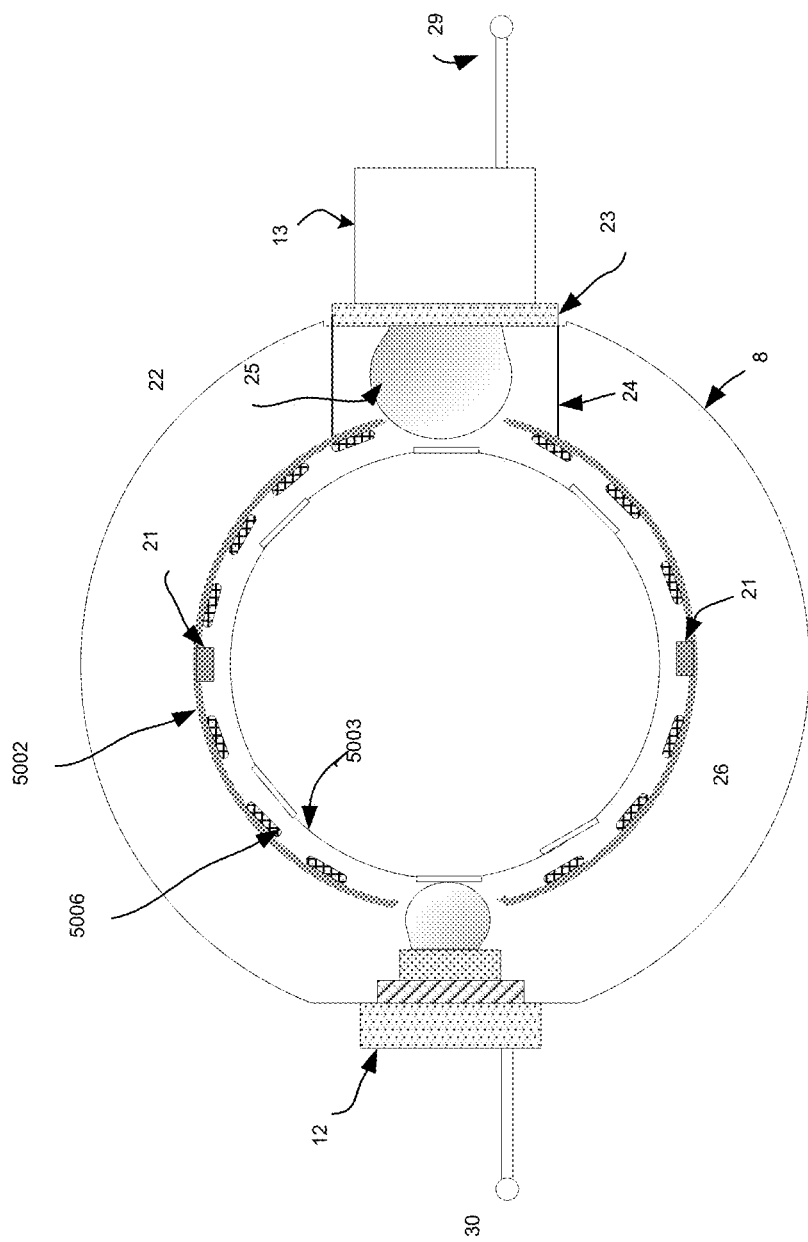

Further, FIG. 13 schematically depicts a deposition system 5000 according to another embodiment, in which, similar to the deposition system 4000 discussed above, only one cooling outer cylinder 5002 surrounding a substrate cylinder 5003 is employed for cooling a plurality of substrates mounted onto the substrate cylinder 5003. However, in this embodiment, a plurality of cooling channels 5006 are disposed on outer surface of the cooling outer cylinder 5002.

EXAMPLES

In one hypothetical example, sputtering can be carried out by affixing substrates on the inner rotating cylinder, lowering the inner cylinder into the outer cylinder and pumping the main chamber to a base of less than or equal to about $1\times10^{-6}$ torr. The inner cylinder can be set to rotate from about 10 to about 600 rpm. The ion source can have $O_2$ flow into it such that a pressure of $5\times10^{-4}$ torr is established. The ion source can be ignited with a neutralization source to provide a source of electrons to the plasma. The cylinder can be set to rotate at a speed of about 100 rev/min. The magnetron can have a gas flow provided such that the pressure at the gauge is about $5\times10^{-3}$ torr. The magnetron power can then be set such that the combination of power and rotational speed is such that no more than 5-7 Angstrom/revolution is deposited on the inner cylinder and substrates. As the metal is deposited at the magnetron, it can subsequently be oxidized at the ion source and the process can be repeated at a rate determined by the rotational speed of the cylinder to which the substrates are affixed. For example, if the magnetron power is at 2 kW, 5 angstroms of film can deposited per rotation and the rotation is 60 rpm or 1 rev/sec, then the rate is 5 Angstrom/sec. For 4 kW magnetron power and 120 rpm (this would still provide 5 Angstrom/rev of film), the effective rate would be 10 Angstrom/sec. As the rotational speed is increased, the power to the magnetron must also be increased to maintain the 5 Angstrom/rev. Likewise, the ion source beam voltage and current may be changed to reflect the increase in the other variables. By proceeding to higher rotational speed and higher magnetron and beam parameters, very high deposition rates may be obtained. Rates higher than the standard bath system may provide for oxide coating.

Although embodiments described herein have concentrated mainly on oxide coatings, one of ordinary skill in the art would understand that the method may be applied to other types of coatings, such as nitrides and carbide coatings. Moreover, although flat substrate are depicted, other substrates and shapes such as plastic or glass aspheres and blade edges may be used. For non-planer or spherical substrates, various masks may be installed, for example at aperture 18, to give a non-uniform thickness of metal films across the substrate.

Those having ordinary skill in the art will appreciate that various changes can be made to the above embodiments without departing from the scope of the invention.

The invention claimed is:

1. A system for depositing a film on a substrate, comprising:
   a metallization source configured to generate metal atoms,
   a reactive species source configured to generate reactive species,
      wherein the reactive species source is positioned across from the metallization source,
   a substrate cylinder configured to rotate between the metallization source and the reactive species source, said substrate cylinder having at least one mount,
   a substrate coupled to the at least one mount of the substrate cylinder,
   an inner cooled cylinder surrounded by the substrate cylinder, and
      wherein the metallization source is configured to deposit the metal atoms onto the substrate and the reactive species source is configured to deposit the reactive species onto the substrate,
      wherein the at least one mount includes an opening that exposes a back surface of the substrate mounted thereto to the inner cooled cylinder to facilitate radiative cooling of the substrate.

2. The system of claim 1, wherein an outer surface of said inner cylinder exhibits an emissivity coefficient of at least about 0.7.

3. The system of claim 1, wherein said inner and said substrate cylinder are concentrically positioned relative to one another.

4. The system of claim 1, further comprising an outer cylinder positioned so as to at least partially surround said pair of inner and substrate cylinders, said outer cylinder being fixedly positioned relative to the metallization source and said reactive source and having first and second openings positioned relative to the metallization source and the reactive source to allows entry of metal atoms and the reactive ionic species into a metallization region and a reaction region, respectively, between said outer cylinder and said substrate cylinder so as to expose a front surface of said at least one substrate to said metal atoms and said reactive ionic species as the rotation of said substrate cylinder brings the at least one substrate in substantial register with said openings.

5. The system of claim 4, wherein said outer cylinder comprises at least one cooling channel for receiving a cooling fluid.

6. The system of claim 1, wherein said metallization source comprises a magnetron sputtering source.

7. The system of claim 1, wherein said reactive ion species comprises any of oxygen ion, nitrogen ion and a carbon-containing ion.

8. The system of claim 7, wherein said carbon-containing ion comprises a hydrocarbon.

9. The system of claim 8, wherein said hydrocarbon comprises $CH_4$.

10. The system of claim 1, wherein said reactive source comprises a plasma source.

11. The system of claim 1, wherein said reactive source comprises a microwave source.

12. The system of claim 10, wherein said plasma source comprises an inductively coupled plasma (ICP) source.

13. The system of claim 1, wherein said at least one reactive species comprises a mixture of at least two different reactive species.

14. The system of claim 13, wherein said mixture of at least two different reactive species comprises a mixture of oxygen and nitrogen ions.

15. The system of claim 6, wherein said magnetron sputtering source is configured to generate aluminum atoms for forming an aluminum film on said substrate and said reactive source is configured to generate oxygen ions for reacting with said aluminum film to form an aluminum oxide layer on said substrate.

16. The system of claim 4, further comprising a pair of baffles coupled to said inner cooled cylinder to limit conductance of said ionic species from the reaction region to the metallization region.

17. The system of claim 1, wherein an outer surface of said inner cylinder is treated with alumina flame spray.

18. The system of claim 1, wherein said cooling fluid maintains an outer surface of said inner cylinder at a temperature less than about 273 K.

19. The system of claim 1, wherein said reactive source is disposed in an evacuated vestibule.

20. The system of claim 19, further comprising:
confinement plates coupled to the vestibule,
wherein the confinement plates are configured to confine a portion of the reactive species between the substrate cylinder and the inner cylinder for removal by the pump.

21. The system of claim 20, wherein the pump is a first pump and the system further comprises:
a second pump configured to provide a gas throughput to the reactive species source.

22. The system of claim 21, wherein the second pump is positioned vertically above the vestibule.

23. The system of claim 22, wherein the second pump is a turbomolecular pump.

24. A system for depositing a film on a substrate comprising:
a metallization source configured to generate metal ions,
a reactive species source configured to generate reactive species,
a substrate cylinder configured to rotate between the metallization source and the reactive species source, said substrate cylinder having at least one mount,
a substrate coupled to the at least one mount of the substrate cylinder,
an optical pyrometer configured to determine a temperature of the substrate,
an inner cooled cylinder that is configured to cool the substrate and is surrounded by the substrate cylinder,
wherein said at least one mount includes at least one opening that exposes a back surface of the substrate mounted thereto to the inner cool cylinder to facilitate radiative cooling of the substrate,
wherein the inner cylinder includes a channel that carries a cooling fluid, a cryogenic chiller coupled to the channel,
a computer system in communication with the optical pyrometer and the cryogenic chiller,
wherein the computer system is configured to change the temperature of the cryogenic chiller based on the determined temperature of the substrate thereby changing a temperature of the cooling fluid flowing through the channel.

25. The system of claim 24, wherein the computer system is further configured to change the temperature of the cryogenic chiller such that inner cylinder cools the substrate to a target temperature.

26. The system of claim 25, wherein the computer system is configured to determine the target temperature based on a material of the substrate.

* * * * *